(12) United States Patent
Chen et al.

(10) Patent No.: US 11,894,503 B2
(45) Date of Patent: Feb. 6, 2024

(54) LIGHT EMITTING DIODE DEVICE

(71) Applicant: Lextar Electronics Corporation, Hsinchu (TW)

(72) Inventors: Shu-Wei Chen, Hsinchu (TW); Ching-Huai Ni, Hsinchu (TW); Kuo-Wei Huang, Hsinchu (TW); Jia-Jhang Kuo, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 18/058,765

(22) Filed: Nov. 24, 2022

(65) Prior Publication Data
US 2023/0090352 A1 Mar. 23, 2023

Related U.S. Application Data

(63) Continuation of application No. 17/027,731, filed on Sep. 22, 2020, now Pat. No. 11,538,970.

(30) Foreign Application Priority Data
Mar. 6, 2020 (CN) .......................... 202010151258.7

(51) Int. Cl.
| | |
|---|---|
| *H01L 33/60* | (2010.01) |
| *H01L 33/48* | (2010.01) |
| *H01L 33/54* | (2010.01) |
| *H01L 33/56* | (2010.01) |
| *H01L 33/02* | (2010.01) |
| *H01L 33/58* | (2010.01) |

(52) U.S. Cl.
CPC ............. *H01L 33/60* (2013.01); *H01L 33/486* (2013.01); *H01L 33/54* (2013.01); *H01L 33/56* (2013.01); *H01L 2933/005* (2013.01)

(58) Field of Classification Search
CPC ....... H01L 33/60; H01L 33/58; H01L 33/486; H01L 2933/005
See application file for complete search history.

(56) References Cited

U.S. PATENT DOCUMENTS

| | | |
|---|---|---|
| 8,587,011 B2 | 11/2013 | Matsuda |
| 9,024,348 B2 | 5/2015 | Koseki et al. |
| 9,041,283 B2 | 5/2015 | Zhang |
| 9,698,319 B2 | 7/2017 | Lee et al. |
| 2006/0183625 A1 | 8/2006 | Miyahara |

(Continued)

FOREIGN PATENT DOCUMENTS

| | | |
|---|---|---|
| CN | 205665499 U | 10/2016 |
| CN | 111384226 A | 7/2020 |

(Continued)

*Primary Examiner* — Antonio B Crite
(74) *Attorney, Agent, or Firm* — CKC & Partners Co., LLC

(57) ABSTRACT

A light emitting diode device includes a substrate, a frame, an LED die and a transparent layer. The frame is located on the substrate. The frame and the substrate collectively define a concave portion. The frame has a light reflectivity ranging from 20% to 40%. The LED die is located on the substrate and within the concave portion. The transparent layer is filled into the concave portion and covering the LED die, wherein the LED die has a side-emitting surface and a top-emitting surface, the side-emitting surface has a luminous intensity greater than that of the top-emitting surface.

18 Claims, 4 Drawing Sheets

(56) References Cited

U.S. PATENT DOCUMENTS

2014/0014993 A1   1/2014   Koseki et al.
2019/0203904 A1   7/2019   Lee et al.
2019/0305203 A1   10/2019   Ukawa et al.

FOREIGN PATENT DOCUMENTS

| JP | 6768093 B2 | 10/2020 | |
|----|----|----|----|
| TW | I411743 B | 10/2013 | |
| TW | I624968 B | 5/2018 | |
| WO | 2019054793 A1 | 3/2019 | |
| WO | WO-2019054793 A1 * | 3/2019 | ....... H01L 23/49861 |
| WO | 2020015437 A1 | 1/2020 | |
| WO | WO-2020015437 A1 * | 1/2020 | ............. H01L 33/46 |

\* cited by examiner

US 11,894,503 B2

LIGHT EMITTING DIODE DEVICE

CROSS-REFERENCE TO RELATED APPLICATION

This application is a continuation of U.S. application Ser. No. 17/027,731, filed Sep. 22, 2020, which claims priority to China Application Serial Number 202010151258.7, filed Mar. 6, 2020, all of which are herein incorporated by reference in their entireties.

BACKGROUND

Field of Invention

The present disclosure relates to a light emitting diode device.

Description of Related Art

Light emitting diode is a light-emitting element made of semiconductor material that can convert electrical energy into light. It has the advantages of small size, high energy conversion efficiency, long life, power saving, etc., so it can be widely used as light source in various electronic applications.

When the light-emitting diodes are used as a backlight of a display, how to reduce the uneven brightness of the backlight module is a problem that suppliers are desperately trying to solve.

SUMMARY

One aspect of the present disclosure is to provide a light emitting diode device includes a substrate, a frame, an LED die and a transparent layer. The frame is located on the substrate. The frame and the substrate collectively define a concave portion. The frame has a light reflectivity ranging from 20% to 40%. The LED die is located on the substrate and within the concave portion. The transparent layer is filled into the concave portion and covering the LED die, wherein the LED die has a side-emitting surface and a top-emitting surface, the side-emitting surface has a luminous intensity greater than that of the top-emitting surface.

In one or more embodiments, the frame has a refractive index between 1.41 and 1.6.

In one or more embodiments, the frame includes 10% to 50% long fibers.

In one or more embodiments, the frame includes at least one of polyethylene terephthalate, aromatic ring bonded high-grade fat-locked semi-aromatic nylon resin, and polyphthalamide.

In one or more embodiments, the transparent layer has a top surface that is lower or higher than a top end of the frame.

In one or more embodiments, the transparent layer includes silicon-based materials.

In one or more embodiments, the silicon-based materials include at least one of phenyl silicone resin and methyl silicone resin.

In one or more embodiments, the LED die has a bottom surface bonded to the substrate, and the bottom surface is a light-reflective surface.

In one or more embodiments, the side-emitting surface has a luminous intensity 10%-60% greater than that of the top-emitting surface.

In one or more embodiments, the LED die is mounted on electrodes of the substrate in a flip-chip manner or wire-bonded to electrodes of the substrate.

In summary, the light emitting diode device disclosed herein utilizes its low-reflectivity frame with a concave portion and its LED die equipped with a greater side luminous intensity than a top luminous intensity to further expand the light emitting angle such that light emitting diode device can effectively improve the uneven brightness of a backlight module when it is used in the backlight module of a display.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
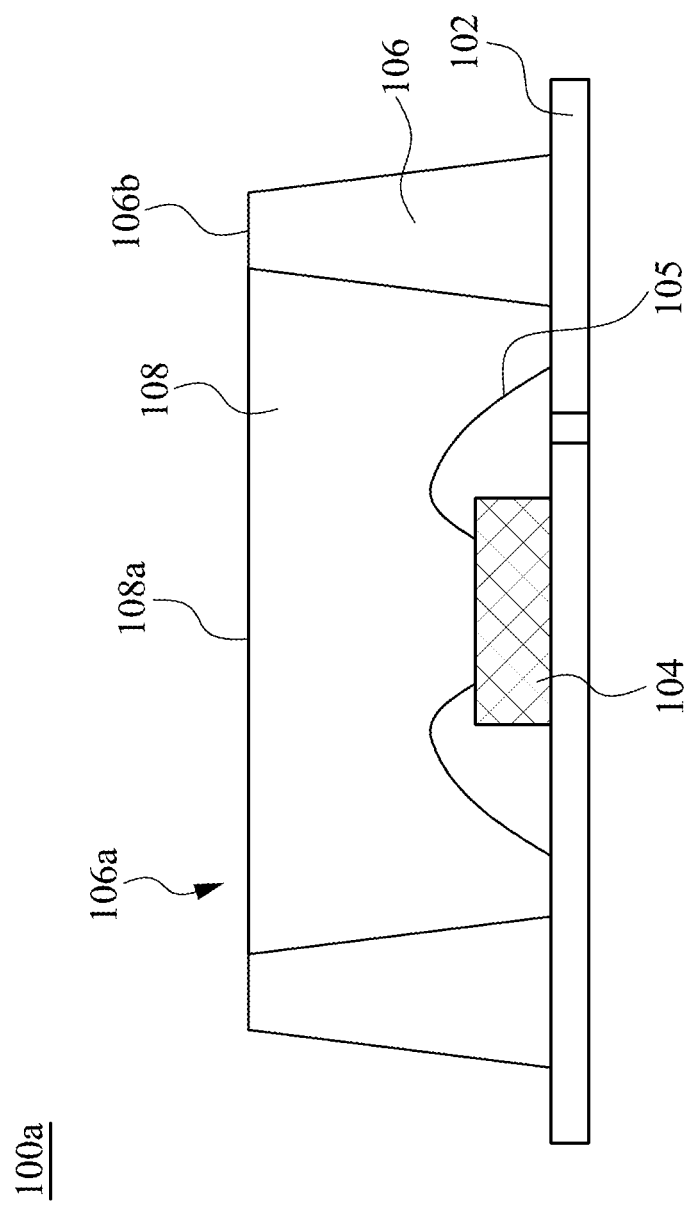
FIG. 1 illustrates a cross-sectional view of an emitting diode device in accordance with an embodiment of the present disclosure.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical elements of the embodiments are designated with the same reference numerals.

Figure 2:
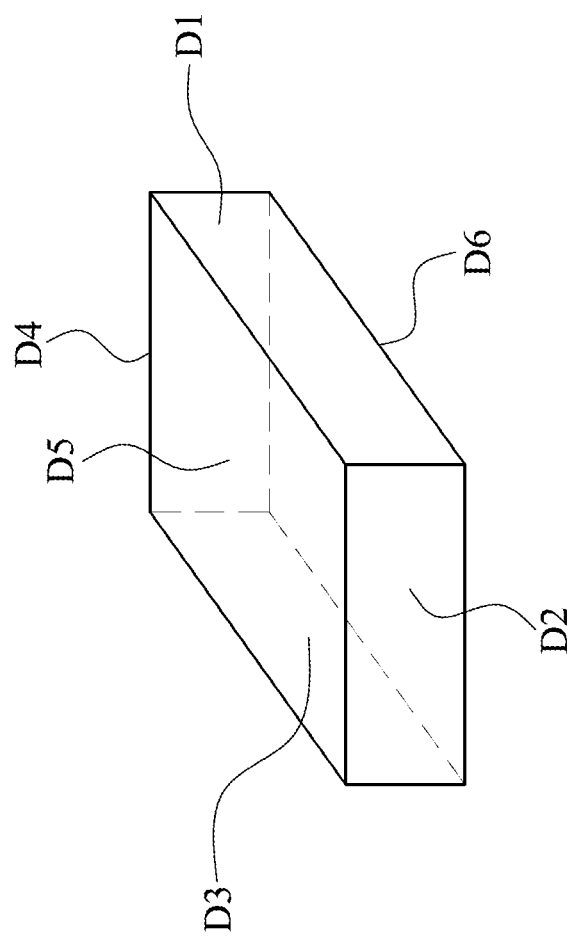
FIG. 2 illustrates a perspective view of an LED die in accordance with an embodiment of the present disclosure.

Referring to FIGS. 1 and 2, FIG. 1 illustrates a cross-sectional view of an emitting diode device in accordance with an embodiment of the present disclosure, and FIG. 2 illustrates a perspective view of an LED die in accordance with an embodiment of the present disclosure. A light emitting diode device 100a includes a substrate 102, a frame 106, an LED die 104 and a transparent layer 108. The frame 106 is secured to the substrate 102, and the frame 106 and substrate 102 collectively defining a concave portion 106a. The frame 106 has a light reflectivity ranging from 20% to 40%. The LED die 104 is mounted on the substrate 102 and within the concave portion 106a. The transparent layer 108 is filled into the concave portion 106a to cover the LED die 104.

The LED die 104 has side-emitting surfaces (D1, D2, D3, D4), a top-emitting surface D5 and a bottom surface D6. In this embodiment, the side-emitting surfaces (D1, D2, D3, D4) of the LED die 104 have a luminous intensity greater than a luminous intensity of the top-emitting surface D5. The LED die 104 has its bottom surface D6 bonded to the substrate 102, and the bottom surface D6 is a light-reflective surface.

In this embodiment, the frame 106 is made from materials including at least one of polyethylene terephthalate, aromatic ring bonded high-grade fat-locked semi-aromatic nylon resin, and polyphthalamide, and the materials may be mixed with 10% to 50% of long fibers in order to achieve a refractive index between 1.41 and 1.6 as well as a light reflectivity ranging from 20% to 40%, but not being limited thereto.

In this embodiment, the top surface 108a of the transparent layer 108 is flush with a top end 106b of the frame 106, but not being limited thereto.

In this embodiment, the transparent layer 108 is made from materials including silicon-based materials, and the silicon-based materials may include at least one of phenyl silicone resin and methyl silicone resin, but not being limited thereto.

In this embodiment, the LED die 104 has its side-emitting surface (D1, D2, D3, D4) with a luminous intensity 10%-60% greater than a luminous intensity of its top-emitting surface D5, but not being limited thereto.

In this embodiment, the LED die 104 is wire-bonded to electrodes of the substrate 102 via wires 105, but not being limited thereto.

In this embodiment, the LED die 104 may be a blue diode chip, but not being limited thereto.

Figure 3:
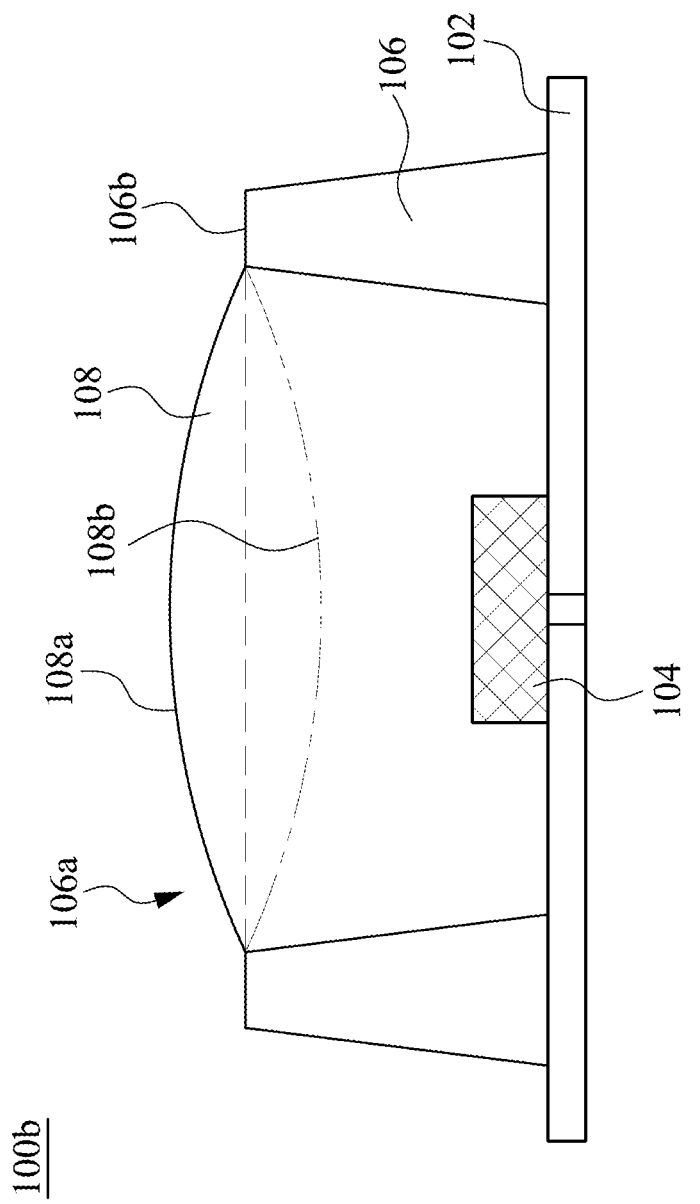
FIG. 3 illustrates a cross-sectional view of an emitting diode device in accordance with another embodiment of the present disclosure.

Referring to FIG. 3, which illustrates a cross-sectional view of an emitting diode device in accordance with another embodiment of the present disclosure. The light emitting diode device 100b is different from the light emitting diode device 100a in that the transparent layer 108 has its top surface 108a that is higher than an extension line (the dash line in FIG. 3) between top ends 106b of the frame 106, or the transparent layer 108 has its top surface 108b that is lower than an extension line (the dash line in FIG. 3) between top ends 106b of the frame 106. In this embodiment, the LED die 104 is mounted on electrodes of the substrate 102 in a flip-chip manner, rather than wire-bonded to electrodes of the substrate 102.

Figure 5:
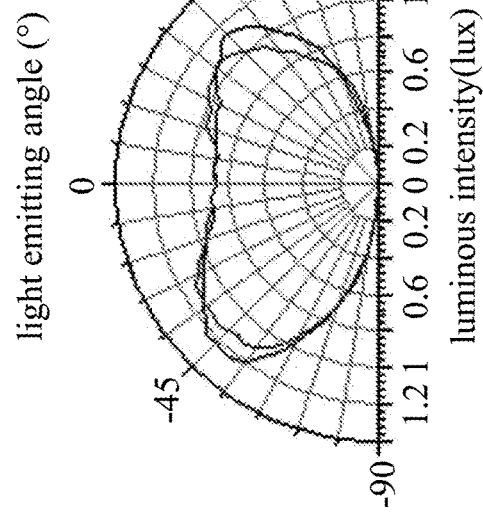
FIG. 5 is a diagram illustrating the relationship between a light emitting angle and a luminous intensity of a light emitting diode device according to another embodiment of the present disclosure.
Figure 6:
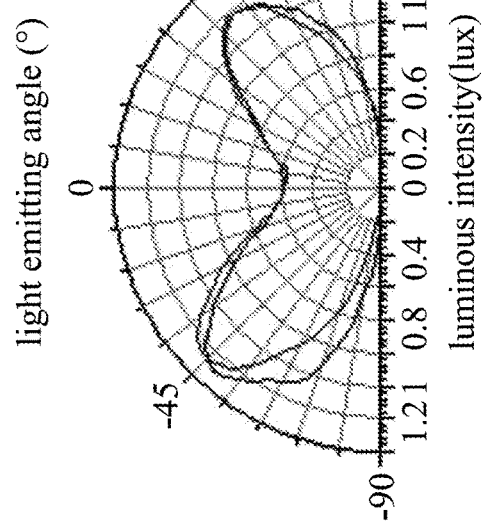
FIG. 6 is a diagram illustrating the relationship between a light emitting angle and a luminous intensity of a light emitting diode device according to another embodiment of the present disclosure.
Figure 4:
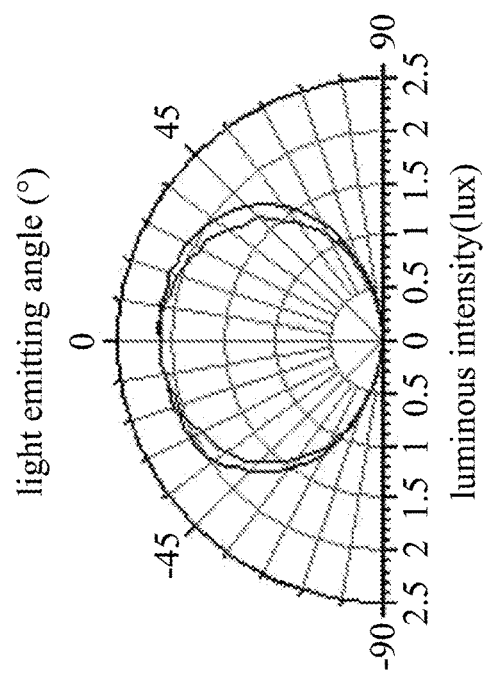
FIG. 4 is a diagram illustrating the relationship between a light emitting angle and a luminous intensity of a light emitting diode device according to an embodiment of the present disclosure.

Referring to FIGS. 4-6, illustrating the relationship between a light emitting angle and a luminous intensity of a light emitting diode device according to three different embodiments of the present disclosure. The two curves in each figure represent the relationship between the light emitting angle and the luminous intensity measured from two mutually perpendicular viewing angles. The relationship curve of FIG. 6 represents the relationship curve measured based on the foregoing embodiment of FIG. 1 or 3, in which the light emitting angle can reach about 150 degrees. The relationship curve in FIG. 5 measured from a different LED die used in the embodiment in FIG. 1 or 3 above, and the LED die has its top-emitting surface with a luminous intensity greater than that of its side-emitting surface, but the frame 106 still maintain a low light reflectance of 20% to 40%, where the light emitting angle can only reach about 138 degrees. The relationship curve in FIG. 4 measured from a different LED die used in the embodiment of FIG. 1 or 3 above, and the LED die has its top-emitting surface with a luminous intensity greater than that of its side-emitting surface, and the frame 106 is replaced by a different frame with a higher light reflectance of 90%, the light emitting angle can only reach about 114 degrees. Comparing the relationship curves in FIGS. 4-6, it can be seen that the light emitting diode device has a frame with a low reflectance and the side-emitting surface of the LED die has a luminous intensity greater than that of its top-emitting surface, which can expand its light emitting angle to about 140-160 degrees and reduce its top luminous intensity. When a plurality of light emitting diode devices are arranged in an array as a backlight module of a display, a greater light emitting angle can effectively improve the uneven brightness of the backlight module.

In summary, the light emitting diode device disclosed herein utilizes its low-reflectivity frame with a concave portion and its LED die equipped with a side luminous intensity greater than a top luminous intensity to further expand the light emitting angle such that light emitting diode device can effectively improve the uneven brightness of a backlight module when it is used in the backlight module of a display.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode device comprising:
   a substrate;
   a frame disposed on the substrate, the frame and the substrate collectively defining a concave portion, the frame comprising aromatic ring bonded high-grade fat-locked semi-aromatic nylon resin and polyphthalamide, and having a light reflectivity ranging from 20% to 40%;
   an LED die disposed on the substrate and within the concave portion; and
   a transparent layer filled into the concave portion and covering the LED die, wherein the LED die has a side-emitting surface and a top-emitting surface, the side-emitting surface has a luminous intensity greater than that of the top-emitting surface.

2. The light emitting diode device of claim 1, wherein the frame has a refractive index between 1.41 and 1.6.

3. The light emitting diode device of claim 1, wherein the frame includes 10% to 50% long fibers.

4. The light emitting diode device of claim 1, wherein the transparent layer has a top surface that is lower or higher than a top end of the frame.

5. The light emitting diode device of claim 1, wherein the LED die has a bottom surface bonded to the substrate, and the bottom surface is a light-reflective surface.

6. The light emitting diode device of claim 1, wherein the side-emitting surface has a luminous intensity 10%-60% greater than that of the top-emitting surface.

7. The light emitting diode device of claim 1, wherein the LED die is mounted on electrodes of the substrate in a flip-chip manner or wire-bonded to electrodes of the substrate.

8. The light emitting diode device of claim 1, wherein the transparent layer includes silicon-based materials.

9. The light emitting diode device of claim 8, wherein the silicon-based materials include at least one of phenyl silicone resin and methyl silicone resin.

10. A light emitting diode device comprising:
   a substrate;
   a frame disposed on the substrate, the frame and the substrate collectively defining a concave portion, the frame comprising aromatic ring bonded high-grade fat-locked semi-aromatic nylon resin and polyethylene terephthalate, and having a light reflectivity ranging from 20% to 40%;
   an LED die disposed on the substrate and within the concave portion; and
   a transparent layer filled into the concave portion and covering the LED die, wherein the LED die has a side-emitting surface and a top-emitting surface, the side-emitting surface has a luminous intensity greater than that of the top-emitting surface.

11. The light emitting diode device of claim 10, wherein the frame has a refractive index between 1.41 and 1.6.

12. The light emitting diode device of claim 10, wherein the frame includes 10% to 50% long fibers.

13. The light emitting diode device of claim 10, wherein the transparent layer has a top surface that is lower or higher than a top end of the frame.

14. The light emitting diode device of claim 10, wherein the LED die has a bottom surface bonded to the substrate, and the bottom surface is a light-reflective surface.

15. The light emitting diode device of claim 10, wherein the side-emitting surface has a luminous intensity 10%-60% greater than that of the top-emitting surface.

16. The light emitting diode device of claim 10, wherein the LED die is mounted on electrodes of the substrate in a flip-chip manner or wire-bonded to electrodes of the substrate.

17. The light emitting diode device of claim 10, wherein the transparent layer includes silicon-based materials.

18. The light emitting diode device of claim 17, wherein the silicon-based materials include at least one of phenyl silicone resin and methyl silicone resin.

\* \* \* \* \*